United States Patent
Tiwari et al.

(10) Patent No.: US 10,515,694 B2
(45) Date of Patent: Dec. 24, 2019

(54) SYSTEM AND METHOD FOR STORING MULTIBIT DATA IN NON-VOLATILE MEMORY

(71) Applicant: Silicon Storage Technology, Inc., San Jose, CA (US)

(72) Inventors: Vipin Tiwari, Dublin, CA (US); Nhan Do, Saratoga, CA (US); Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/148,304

(22) Filed: Oct. 1, 2018

(65) Prior Publication Data

US 2019/0139602 A1 May 9, 2019

Related U.S. Application Data

(60) Provisional application No. 62/581,489, filed on Nov. 3, 2017.

(51) Int. Cl.
| | |
|---|---|
| *G11C 11/56* | (2006.01) |
| *G11C 16/34* | (2006.01) |
| *G11C 16/26* | (2006.01) |
| *G11C 16/04* | (2006.01) |
| *G11C 16/10* | (2006.01) |

(52) U.S. Cl.
CPC ...... *G11C 11/5642* (2013.01); *G11C 16/0425* (2013.01); *G11C 16/26* (2013.01); *G11C 16/34* (2013.01); *G11C 11/5628* (2013.01); *G11C 16/0458* (2013.01); *G11C 16/0475* (2013.01); *G11C 16/10* (2013.01)

(58) Field of Classification Search
None
See application file for complete search history.

(56) References Cited

U.S. PATENT DOCUMENTS

| | | |
|---|---|---|
| 5,029,130 A | 7/1991 | Yeh |
| 6,288,931 B1 | 9/2001 | Kye et al. |
| 7,315,056 B2 | 1/2008 | Klinger et al. |
| 7,868,375 B2 | 1/2011 | Liu et al. |

(Continued)

FOREIGN PATENT DOCUMENTS

| | | |
|---|---|---|
| TW | 2011 01315 A | 1/2011 |
| TW | 2015 35388 A | 9/2015 |
| TW | 2016 29973 A | 8/2016 |

*Primary Examiner* — Tan T. Nguyen
(74) *Attorney, Agent, or Firm* — DLA Piper LLP (US)

(57) ABSTRACT

A method of reading a memory device having a plurality of memory cells by, and a device configured for, reading a first memory cell of the plurality of memory cells to generate a first read current, reading a second memory cell of the plurality of memory cells to generate a second read current, applying a first offset value to the second read current, and then combining the first and second read currents to form a third read current, and then determining a program state using the third read current. Alternately, a first voltage is generated from the first read current, a second voltage is generated from the second read current, whereby the offset value is applied to the second voltage, wherein the first and second voltages are combined to form a third voltage, and then the program state is determined using the third voltage.

24 Claims, 9 Drawing Sheets

(56) References Cited

U.S. PATENT DOCUMENTS

| | | |
|---|---|---|
| 2005/0201148 A1 | 9/2005 | Chen |
| 2008/0117678 A1 | 5/2008 | Shieh |
| 2012/0250400 A1 | 10/2012 | Katayama |
| 2014/0241039 A1 | 8/2014 | Oh |
| 2015/0085571 A1* | 3/2015 | Hu .................. G11C 16/26 365/185.03 |
| 2016/0064058 A1* | 3/2016 | Janesky ............ G11C 29/12 365/96 |
| 2016/0148701 A1* | 5/2016 | Karakulak ........ G11C 16/26 365/185.18 |

* cited by examiner

FIGURE 6B
Cell 2

FIGURE 6A
Cell 1

FIGURE 6C
Cells 1 and 2

SYSTEM AND METHOD FOR STORING MULTIBIT DATA IN NON-VOLATILE MEMORY

RELATED APPLICATIONS

This application claims the benefit of U.S. Provisional Application No. 62/581,489, filed Nov. 3, 2017, and which is incorporated herein by reference.

FIELD OF THE INVENTION

The present invention relates to non-volatile memory devices, and more particularly to increasing the number of bits that can be stored therein.

BACKGROUND OF THE INVENTION

Non-volatile memory devices are well known in the art. For example, a split-gate memory cell is disclosed in U.S. Pat. No. 5,029,130. This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region to determine the programming state of the floating gate).

The configuration and number of gates in non-volatile memory cells can vary. For example, U.S. Pat. No. 7,315,056 discloses a memory cell that additionally includes a program/erase gate over the source region. U.S. Pat. No. 7,868,375 discloses a memory cell that additionally includes an erase gate over the source region and a coupling gate over the floating gate.

Figure 1:
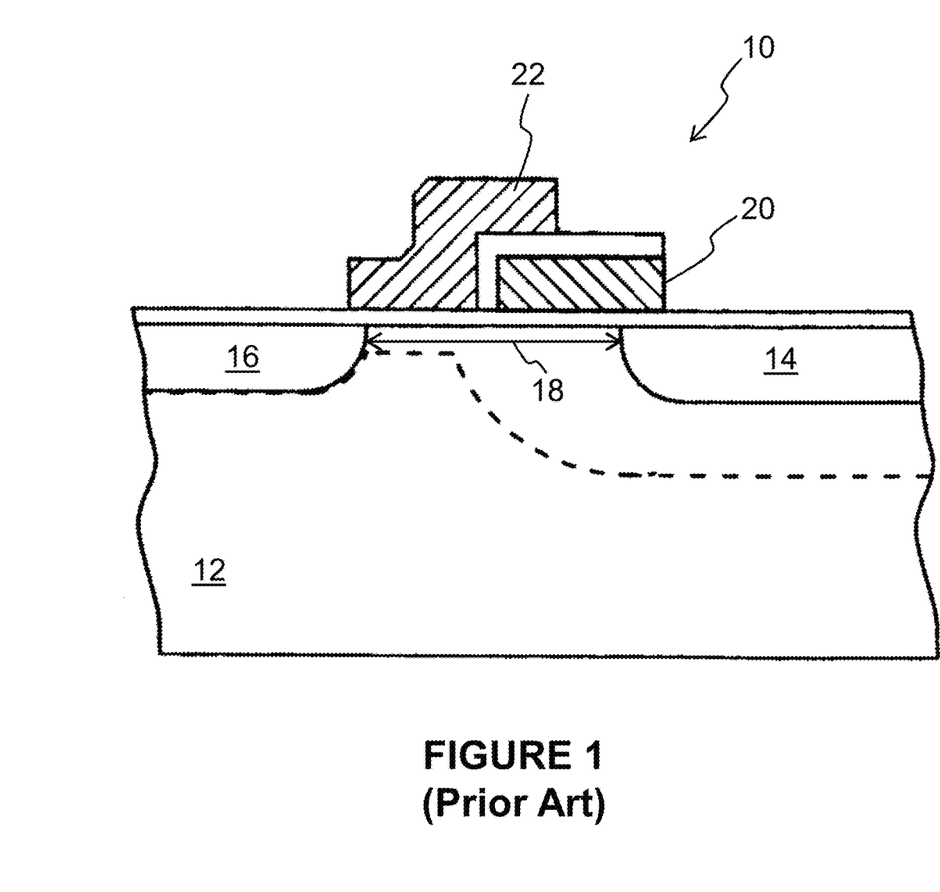
FIG. 1 is a side cross sectional view of a first conventional split gate non-volatile memory cell.

FIG. 1 illustrates a split gate memory cell 10 with spaced apart source and drain regions 14/16 formed in a silicon semiconductor substrate 12. A channel region 18 of the substrate is defined between the source/drain regions 14/16. A floating gate 20 is disposed over and insulated from a first portion of the channel region 18 (and partially over and insulated from the source region 14). A control gate (also referred to as a word line gate or select gate) 22 has a lower portion disposed over and insulated from a second portion of the channel region 18, and an upper portion that extends up and over the floating gate 20 (i.e., the control gate 22 wraps around an upper edge of the floating gate 20).

Memory cell 10 can be erased by placing a high positive voltage on the control gate 22, and a reference potential on the source and drain regions 14/16. The high voltage drop between the floating gate 20 and control gate 22 will cause electrons on the floating gate 20 to tunnel from the floating gate 20, through the intervening insulation, to the control gate 22 by the well-known Fowler-Nordheim tunneling mechanism (leaving the floating gate 20 more positively charged—the erased state). Memory cell 10 can be programmed by applying a ground potential to drain region 16, a positive voltage on source region 14, and a positive voltage on the control gate 22. Electrons will then flow from the drain region 16 toward the source region 14, with some electrons becoming accelerated and heated whereby they are injected onto the floating gate 20 (leaving the floating gate negatively charged—the programmed state). Memory cell 10 can be read by placing ground potential on the drain region 16, a positive voltage on the source region 14 and a positive voltage on the control gate 22 (turning on the channel region portion under the control gate 22). If the floating gate is more positively charged (erased), the positive voltage on the control gate will at least partially couple to the floating gate to turn on the channel region portion under the floating gate, and electrical current will flow from source region 14 to drain region 16 (i.e. the memory cell 10 is sensed to be in its erased "1" state based on sensed current flow). If the floating gate 20 is negatively charged (programmed), the coupled voltage from the control gate 22 will not overcome the negative charge of the floating gate, and the channel region under the floating gate is weakly turned on or turned off, thereby reducing or preventing any current flow (i.e., the memory cell 10 is sensed to be in its programmed "0" state based on sensed low or no current flow).

Figure 2:
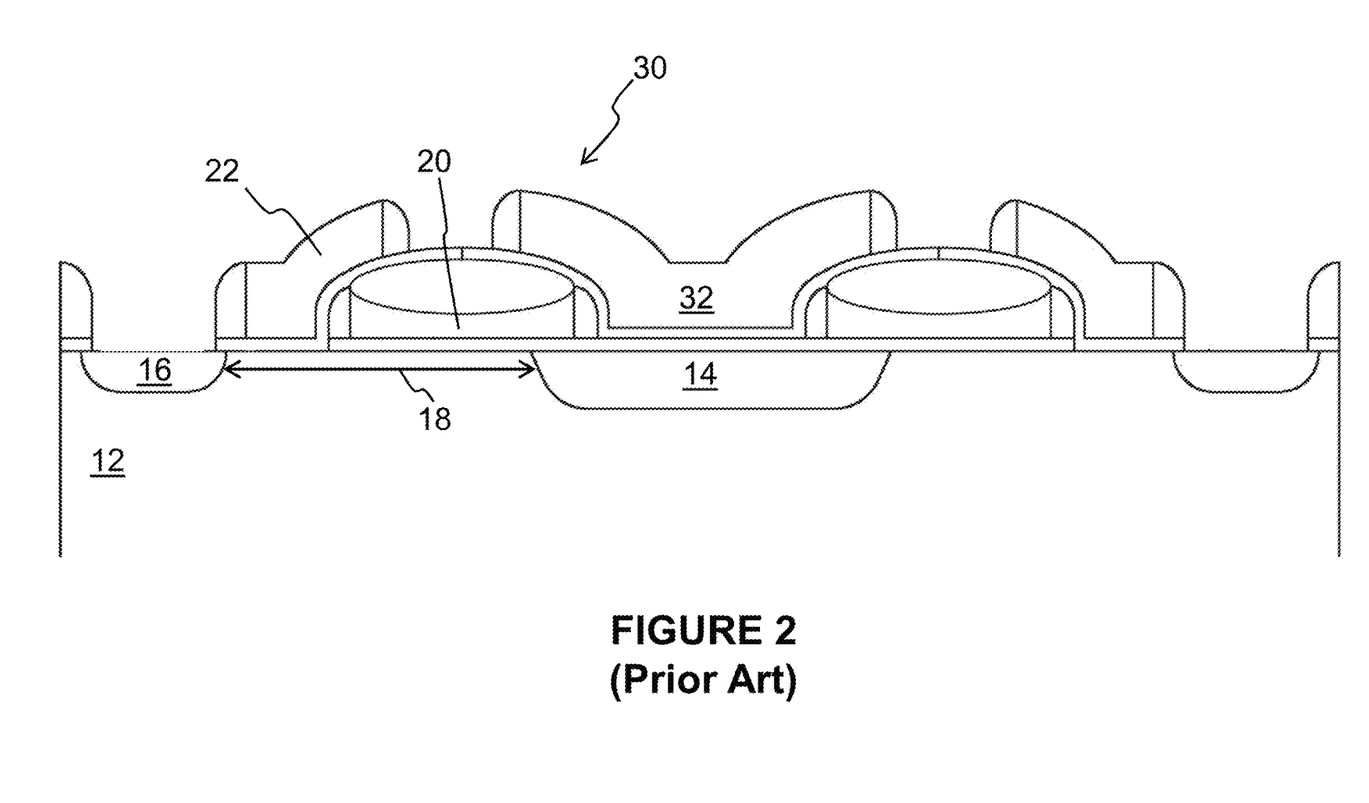
FIG. 2 is a side cross sectional view of a second conventional split gate non-volatile memory cell.

FIG. 2 illustrates an alternate split gate memory cell 30 with same elements as memory cell 10, but additionally with a program/erase (PE) gate 32 disposed over and insulated from the source region 14 (i.e. this is a three gate design). Memory cell 30 can be erased by placing a high voltage on the PE gate 32 to induce tunneling of electrons from the floating gate 20 to the PE gate 32. Memory cell 30 can be programmed by placing positive voltages on the control gate 22, PE gate 32 and source region 14, and a current on drain region 16, to inject electrons from the current flowing through the channel region 18 onto floating gate 20. Memory cell 30 can be read by placing positive voltages on the control gate 22 and drain region 16, and sensing current flow.

Figure 3:
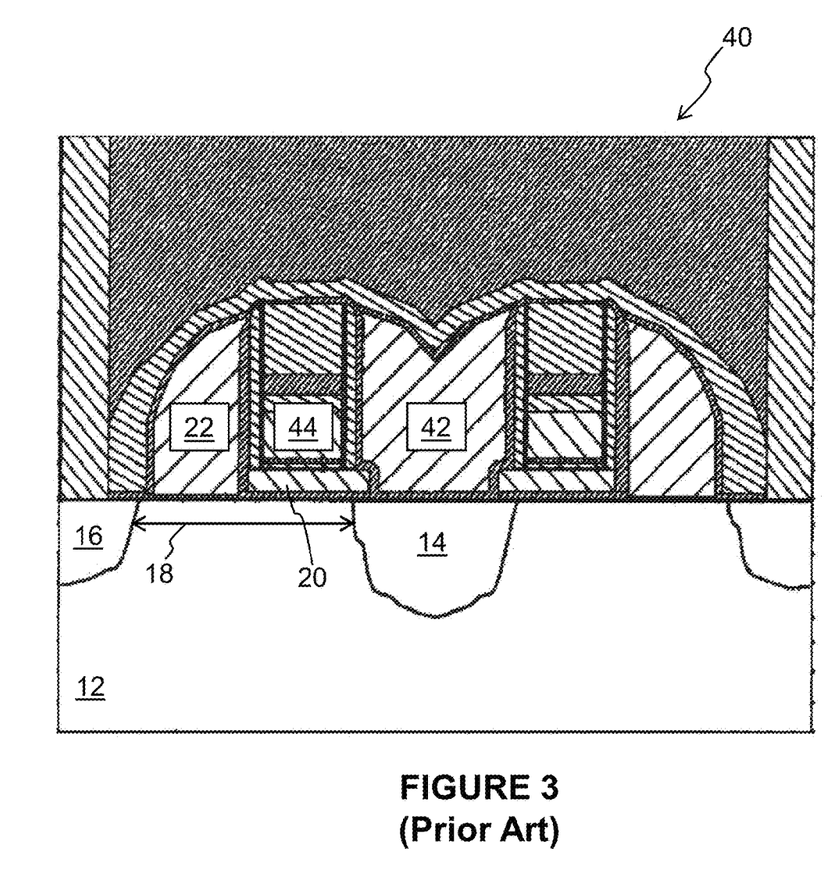
FIG. 3 is a side cross sectional view of a third conventional split gate non-volatile memory cell.

FIG. 3 illustrates an alternate split gate memory cell 40 with same elements as memory cell 10, but additionally with an erase gate 42 disposed over and insulated from the source region 14, and a coupling gate 44 over and insulated from the floating gate 20. Memory cell 40 can be erased by placing a high voltage on the erase gate 42 (and optionally a negative voltage on the coupling gate 44) to induce tunneling of electrons from the floating gate 20 to the erase gate 42. Memory cell 40 can be programmed by placing positive voltages on the control gate 22, erase gate 42, coupling gate 44 and source region 14, and a current on drain region 16, to inject electrons from the current flowing through the channel region 18 onto floating gate 20. Memory cell 30 can be read by placing positive voltages on the control gate 22 and drain region 16 (and optionally on the erase gate 42 and/or the coupling gate 44), and sensing current flow.

For all the above referenced memory cells, voltages are applied in each of the program, erase and read operations to program the memory cells to a "0" state, erase the memory cells to a "1" state, and to read the memory cells to determine whether they are in the programmed state or the erased state. One drawback to such memory devices is that each memory cell can only store one bit of data (i.e., the cell has only two possible states). There is a need to program more than one bit of data in each memory cell. It is also known to operate the above described memory cells in an analog fashion so that the memory cell can store more than just two binary values (i.e., just one bit of information). For example, the memory cells can be operated below their threshold voltage, meaning that instead of fully programming or fully erasing the memory cells, they can be only partially programmed or partially erased, and operated in an analog fashion below the threshold voltage of the memory cell. It is also possible to program the memory cells to one of multiple program states above the threshold voltage too. However, if discrete programming states are desired, it can be difficult to reliably program and read the memory cells because the read current values for the various states are so close together.

BRIEF SUMMARY OF THE INVENTION

The aforementioned problems and needs are addressed by a method of reading a memory device having a plurality of memory cells, by reading a first memory cell of the plurality of memory cells to generate a first read current, reading a second memory cell of the plurality of memory cells to generate a second read current, applying a first offset value to the second read current, and then combining the first and second read currents to form a third read current, and then determining a program state using the third read current.

A method of reading a memory device having a plurality of memory cells includes reading a first memory cell of the plurality of memory cells to generate a first read current, reading a second memory cell of the plurality of memory cells to generate a second read current, generating a first voltage from the first read current, generating a second voltage from the second read current, applying a first offset value to the second voltage, and then combining the first and second voltages to form a third voltage, and then determining a program state using the third voltage.

A memory device includes a semiconductor substrate, a plurality of memory cells formed on the semiconductor substrate, and circuitry formed on the semiconductor substrate and configured to read a first memory cell of the plurality of memory cells to generate a first read current, read a second memory cell of the plurality of memory cells to generate a second read current, apply a first offset value to the second read current, and then combine the first and second read currents to form a third read current, and then determine a program state using the third read current.

A memory device includes a semiconductor substrate, a plurality of memory cells formed on the semiconductor substrate, and circuitry formed on the semiconductor substrate and configured to read a first memory cell of the plurality of memory cells to generate a first read current, read a second memory cell of the plurality of memory cells to generate a second read current, generate a first voltage from the first read current, generate a second voltage from the second read current, apply a first offset value to the second voltage, and then combine the first and second voltages to form a third voltage, and then determine a program state using the third voltage.

Other objects and features of the present invention will become apparent by a review of the specification, claims and appended figures.

DETAILED DESCRIPTION OF THE INVENTION

The present invention is directed to non-volatile memory devices capable of storing more than one bit of information in each memory cell. This can be done by operating the memory cells above and/or below their threshold voltage. For example, instead of fully programming or fully erasing the memory cells, they can be only partially programmed or partially erased, and operated in an analog fashion. The following description focuses on memory cells operating below the threshold voltage of the memory cell. However, it equally applies to memory cells operated above the threshold voltage of the memory cell as well.

To best illustrate the present invention, the sub-threshold relationship between channel current as a function of control gate voltage is described. For any given programmed state of the memory cell, as the control gate voltage gradually increases, the channel current gradually rises. When plotted as a function of the log of channel current, this relationship is linear. Moreover, as the memory cell programming state is changed (e.g., as the number of electrons programmed onto the floating gate changes), the linear logarithmic relationship of current as a function of control gate voltage shifts up and down.

Figure 4:
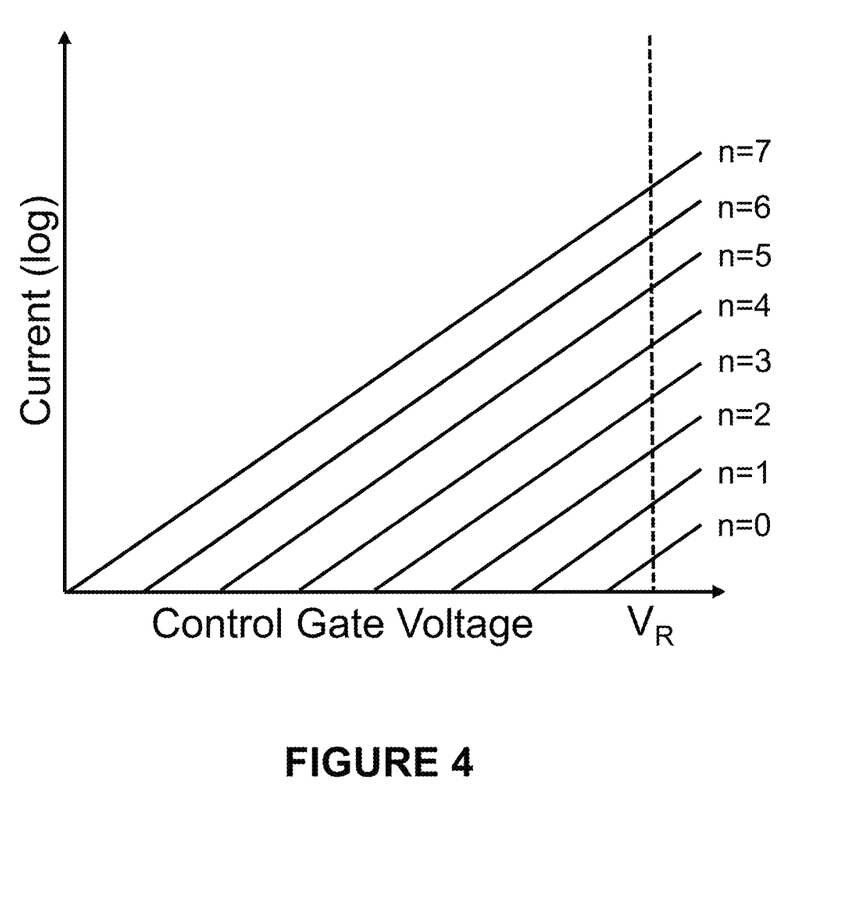
FIG. 4 is a graph illustrating the current versus voltage characteristics for eight program states of a non-volatile memory cell.

This relationship is illustrated in FIG. 4. The linear logarithmic relationship of current (through the channel region) as a function of control gate voltage is represented for multiple different program states. The program state n=0 represents the highest program state of the memory cell (i.e., the most electrons on the floating gate that still allows read current—programming beyond this point essentially turns the memory cell current off for all control gate voltages used to read the memory cells) and the program state n=7 represents the lowest program state of the memory cell (i.e., the least electrons on the floating gate, which corresponds to the highest erase state). The memory cell represented by FIG. 4 can theoretically store multiple bits of information, because it can be programmed into 8 different states. By measuring the current at one or more specific control gate voltages, such as read voltage $V_R$, the program state n can be determined.

One issue with a memory cell configured to store n program states as indicated in FIG. 4 is that the difference in read current for two adjacent program states can be too small (i.e., the program states are too close together) for reliable operation when the number of states n exceeds just a few. Program states too close together are susceptible to noise on the program and/or reading of the memory cells. For example, there would be a small range of variation in terms of how reliably the memory cell can be programmed into any given program state. Similarly, there would be a small range of variation in terms of how reliably the state of the cell can be read by measuring the read currents. Therefore, the n states cannot be located too close to each other, otherwise they could not reliably be distinguished from each other. This places a practical limit on the number of states n that can be programmed into a single memory cell, which means there is a practical limit on the number of states n that can be stored in the memory device.

Figure 5A:
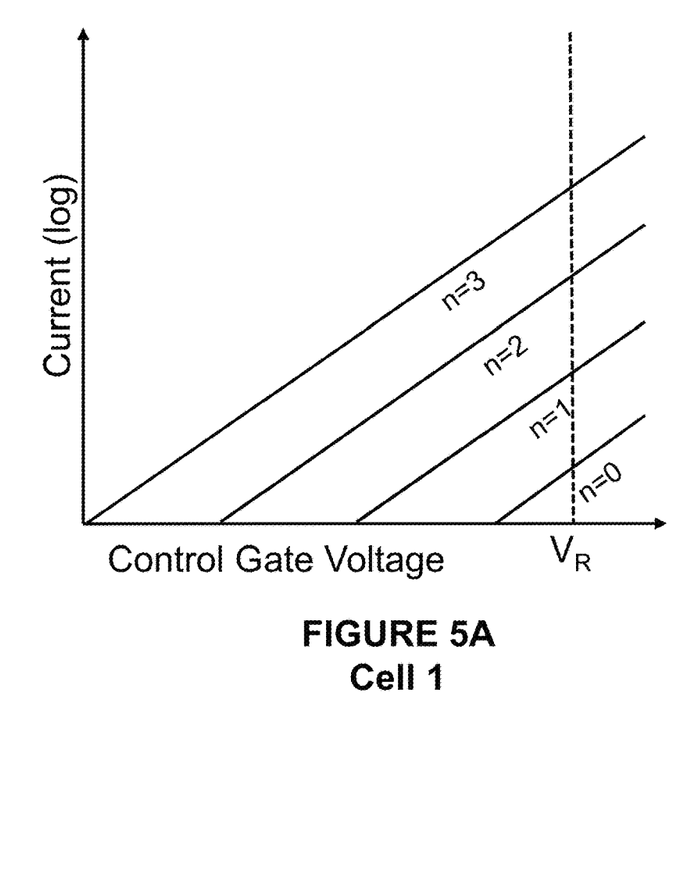
FIGS. 5A-5B are graphs illustrating the current versus voltage characteristics for eight program states of two non-volatile memory cell.
Figure 5B:
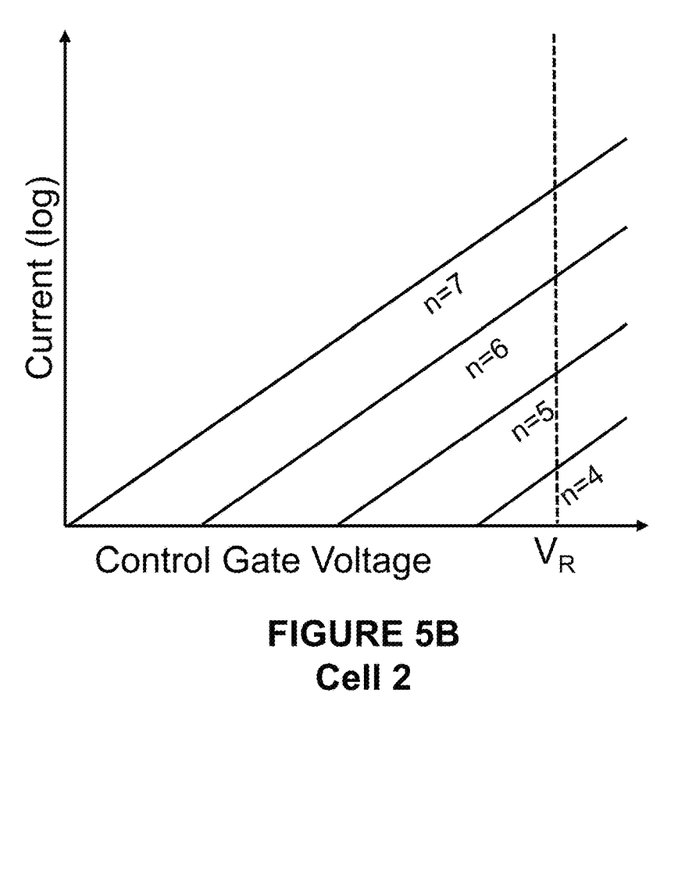

FIGS. 5A-5B illustrate a solution to the above described problem. Specifically, the different states n can be stored over multiple memory cells. For example, the 8 program states stored in a single memory cell of FIG. 4 can be stored in two different cells, the first four states (n=0 to n=3) can be stored in a first cell (FIG. 5A, cell 1), and the last four states (n=4 to n=7) can be stored in a second cell (FIG. 5B, cell 2). Using two cells, the same number of total states can be stored, but with twice the separation between adjacent program states for better reliability. Or, said another way, twice as many states can be stored with a given separation between adjacent program states using two memory cells relative to using just a single cell.

Splitting up program states over two (or more) cells as described above solves the program state separation issue, but creates another issue. Ideally, to simplify design configuration and operation, the read currents of both cells would be added together, and the combined read current is used to determine which of the 8 possible bits (corresponding to the one of 8 possible program states) is programmed into the pair of memory cells. However, as is evident from FIGS. 5A-5B, different states in different cells have the same current/voltage characteristics. For example, state n=0 in cell 1 produces the same read current output as state n=4 in cell 2. The same is true for the other states (n=1 and n=5 produce the same read current, and so on). Therefore, even if one cell is fully programmed to be off when the read voltage VR is applied, there is no way to determine which state the read current applies to. For example, if the bit value corresponds to program state n=6, and cell 2 is programmed to n=6 and cell 1 is programmed to be off, when later reading back a combined read current from the two cells, it could not be determined if the combined read current corresponds with program state 6 or program state 2.

Figure 6A:
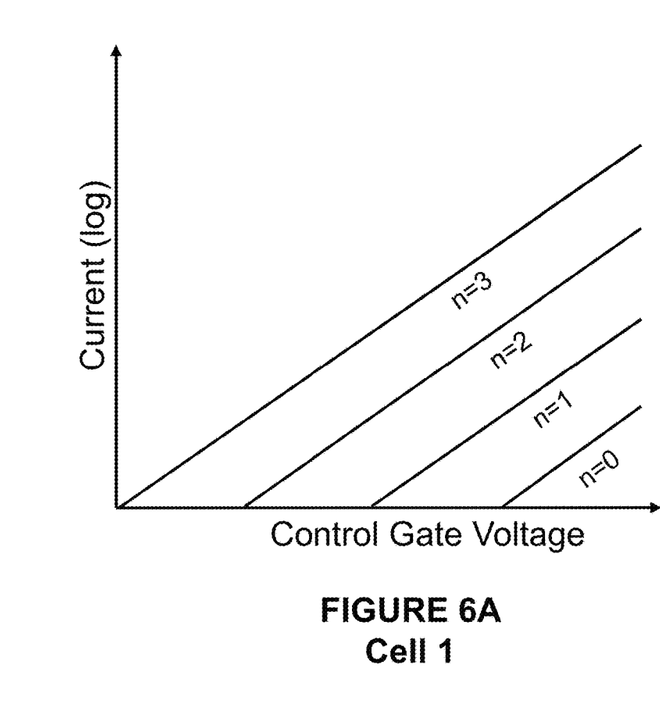
FIGS. 6A-6B are graphs illustrating the current versus voltage characteristics for eight program states of two non-volatile memory cells, with the program states of the second cell shifted relative to those of the first.
Figure 6B:
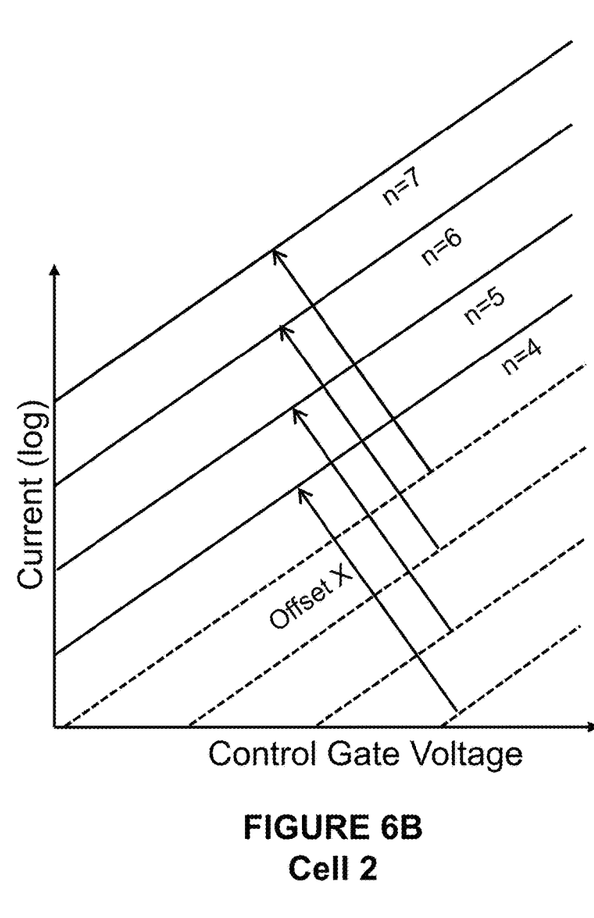
Figure 6C:
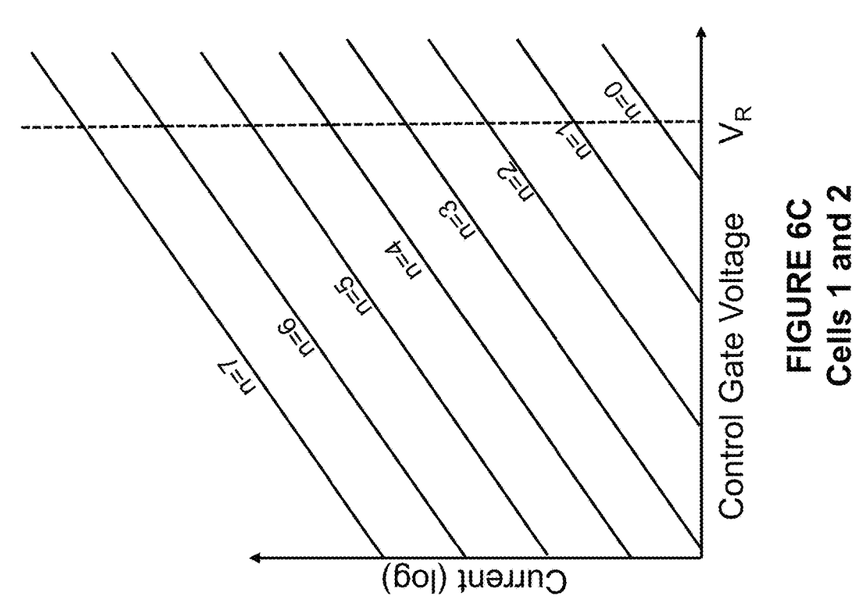
FIG. 6C is a graph illustrating collectively the current versus voltage characteristics for eight program states of two non-volatile memory cells.

To overcome this issue, an offset X is applied to the read current from cell 2, so that the read current readings from cell 2 are effectively shifted above any of the possible current readings from cell 1. For example, the current levels for state 3 in cell 1 could be added to the read current of cell 2. Therefore, all the possible read currents for the four states in cell 1 would not overlap with any of the possible read currents for the four states in cell 2. This is represented in FIGS. 6A-6B. Therefore, assuming the programming state of n=3 of cell 1 is the maximum program state for both cells (i.e., the read current shown for program state n=3 is the maximum read current for each memory cell), non-overlapping read currents exceeding that of programming state n=3 can be provided by cell 2 for all the possible program states of cell 2. The read currents for both cells for all the possible program states (n=0-3 for cell 1 and n=4-7 for cell 2) are collectively shown in FIG. 6C. This means that the program states of both cells can be uniquely determined using a single read voltage VR on the control gates after the two cell currents are added together, yet the program states are sufficiently separated because the read current for cell 2 is allowed to exceed the maximum read current that could otherwise be generated by the cell. For example, if the bit being stored in the pair of cells corresponds to program state n=6, then cell 2 is programmed to state n=6, and cell 1 is programmed to be off. Then during a read operation, the n=6 state can be read uniquely from any of the other states. Similarly, if the bit being stored in the pair of cells corresponds to program state n=1, then cell 1 is programmed to state n=1, and cell 2 is programmed to be off. Then during a read operation, the n=1 state can be read uniquely from any of the other states.

Implementing the offset X for cell 2 can be done using an adding circuit that adds a current offset X to the read current from cell 2 before the read current from cell 2 is added to the cell current from cell 1 (e.g., the adding circuit is part of the sense amplifier that is used to detect currents through the cells). Or, the adding circuit can add a voltage offset X to a voltage signal that is generated by the sense amplifier to reflect the current being detected through cell 2. In this case, it would be the voltages signals (corresponding to the detected current levels) that are added together before determining from the combined voltage signal which program state was read from the pair of memory cells. Or, a multiplier circuit can be as part of, or downstream of, the sense amplifier to multiply the current or voltage signal for cell 2 before being added to the current/voltage signal for cell 1. The offset X, whether it be a voltage offset or a current offset, could be stored in a reference cell (i.e., a memory cell in the memory cell array dedicated for this purpose), so that the proper amount of offset is reliably applied to the voltage or current signal for cell 2 for that given die.

Figure 7:
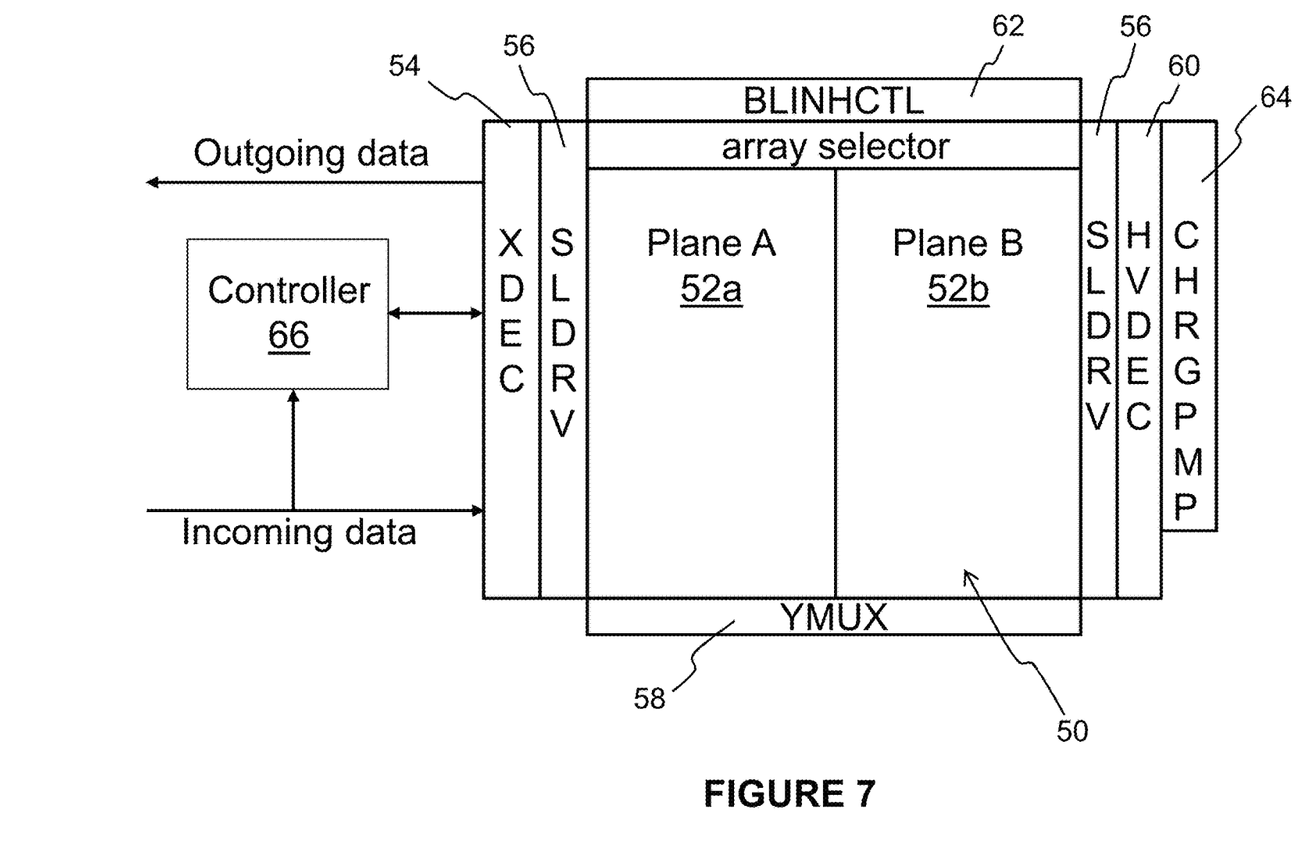
FIG. 7 is a plan view of a memory device architecture.

The architecture of an exemplary memory device is illustrated in FIG. 7. The memory device includes an array 50 of non-volatile memory cells, which can be segregated into two separate planes (Plane A 52a and Plane B 52b). The memory cells can be of the type shown in FIGS. 1-3, formed on a single chip, arranged in a plurality of rows and columns in the semiconductor substrate 12. Adjacent to the array of non-volatile memory cells are address decoders (e.g. XDEC 54 (row decoder), SLDRV 56, YMUX 58 (column decoder), HVDEC 60) and a bit line controller (BLINHCTL 62), which are used to decode addresses and supply the various voltages to the various memory cell gates and regions during read, program, and erase operations for selected memory cells. Column decoder 58 includes sense amplifiers for measuring the voltages or currents on the bit lines during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. The offset X and signal adding can be implemented, for example, with circuitry in the controller 66. Alternately or additionally, the offset X and signal adding can be implemented with circuitry in the sense amplifier portion of the column decoder YMUX 58.

While the above described embodiment was illustrated in the context of two memory cells and 8 states n, different numbers of cells, total states n, and states n per memory cell can vary. The number of total bits, and therefore states, can be enlarged to any desired number simply by increasing the number of cells being used to store the n states. For example, if three cells are used, then a first offset is applied to the read current or voltage of the second cell, and a second (different) offset is applied to the read current or voltage of the third cell, so the program state read currents/voltages for all three cells do not overlap.

Figure 8:
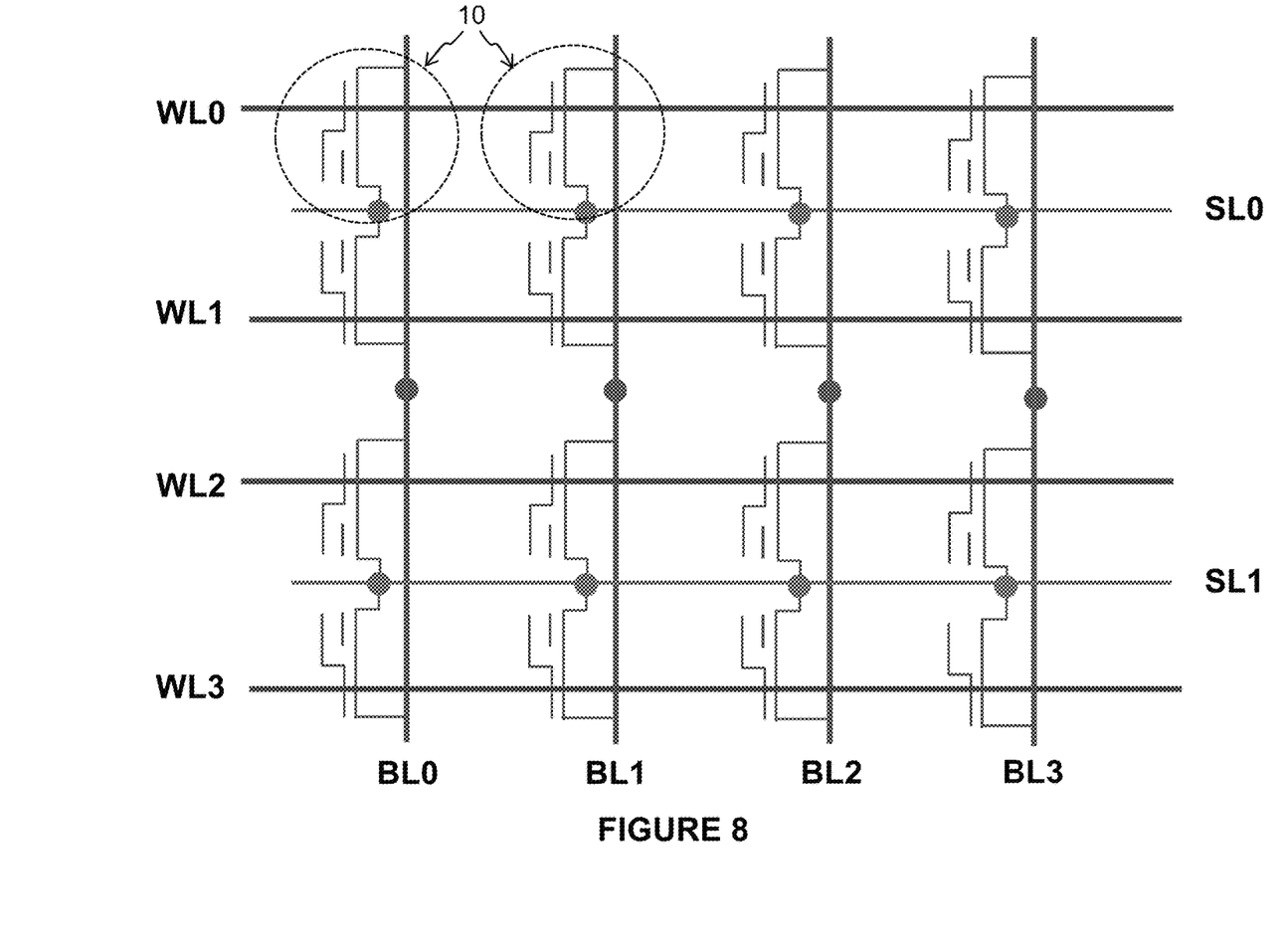
FIG. 8 is a schematic diagram illustrating the layout of an array of the memory cells.

FIG. 8 shows the array configuration for the two-gate memory cells of FIG. 1, where the memory cells are arranged in rows and columns. This array configuration equally applies to the memory cells of FIGS. 2-3, whereby additional lines would be added for the additional gates. Word lines WL each connect to the control gates for one row of memory cells. Bit lines BL each connect to the drain regions for one column of memory cells. Source lines SL each connect to the source regions for one row of a pair of memory cells. Preferably, each of cells having their read currents or voltages added together are disposed in different columns so the read process is faster. Therefore, for the example above where two memory cells are used, cell 1 would be in column 1 connected to bit line BL0, and cell 2 would be in column 2 connected to bit line BL1. During a read operation, the read current for cell 1 is detected on bit line BL0 and the read current for cell 2 is detected on bit line BL1. Circuitry in the sense amplifiers or downstream from there will add the offset X to the read current on bit line BL1 (or the voltage corresponding thereto) and then add the read currents (or voltages) from both cells to each other and then determine from the combined read current/voltage what program state is programmed in the pair of memory cells.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. While the invention is described with respect to sub-threshold operation of the memory cells, it could be implemented in memory cells operated above threshold (in which case the logarithmic relationship between the current and the voltage may no longer apply). It should be noted that programming a cell to its highest program state shown in the figures actually involves an erase operation where the highest program state is a fully erased memory cell. Applying offset X is disclosed above by adding to (increasing) the value of the current or voltage by the amount X. However, applying offset X could include a negative offset, which can be achieved by subtracting from (decreasing) the value of the current or voltage by the amount X. Materials, processes and numerical examples described above are exemplary only, and should not be deemed to limit the claims. Further, as is apparent from the claims and specification, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of reading a memory device having a plurality of memory cells, comprising:
    reading a first memory cell of the plurality of memory cells to generate a first read current;
    reading a second memory cell of the plurality of memory cells to generate a second read current;
    applying a first offset value to the second read current; then
    combining the first read current and the second read current having the first offset value to form a third read current; and then
    determining a program state using the third read current.

2. The method of claim 1, wherein the combining comprises adding the first read current and the second read current having the first offset value together.

3. The method of claim 1, further comprising:
    reading a third memory cell of the plurality of memory cells to generate a fourth read current;
    applying a second offset value to the fourth read current;
    wherein the combining including combining the first read current, the second read current having the first offset value and the fourth read current having the second offset value to form the third read current.

4. The method of claim 3, wherein the second offset value is different from the first offset value.

5. The method of claim 3, wherein the combining comprises adding the first read current, the second read current having the first offset value and the fourth read current having the second offset value together.

6. The method of claim 1, wherein the plurality of memory cells are arranged in an array of rows and columns of the memory cells, wherein each of the columns includes a bit line connected to the memory cells therein, wherein the first memory cell is disposed in a first one of the columns, and wherein the second memory cell is disposed in a second one of the columns different than the first one of the columns.

7. A method of reading a memory device having a plurality of memory cells, comprising:
    reading a first memory cell of the plurality of memory cells to generate a first read current;
    reading a second memory cell of the plurality of memory cells to generate a second read current;
    generating a first voltage from the first read current;
    generating a second voltage from the second read current;
    applying a first offset value to the second voltage; then
    combining the first voltage and the second voltage having the first offset value to form a third voltage; and then
    determining a program state using the third voltage.

8. The method of claim 7, wherein the combining comprises adding the first voltage and the second voltage having the first offset value together.

9. The method of claim 7, further comprising:
    reading a third memory cell of the plurality of memory cells to generate a third read current;
    generating a fourth voltage from the third read current;
    applying a second offset value to the fourth voltage;
    wherein the combining including combining the first voltage, the second voltage having the first offset value and the fourth voltage having the second offset value to form the third voltage.

10. The method of claim 9, wherein the second offset value is different from the first offset value.

11. The method of claim 9, wherein the combining comprises adding the first voltage, the second voltage having the first offset value and the fourth voltage having the second offset value together.

12. The method of claim 7, wherein the plurality of memory cells are arranged in an array of rows and columns of the memory cells, wherein each of the columns includes a bit line connected to the memory cells therein, wherein the first memory cell is disposed in a first one of the columns, and wherein the second memory cell is disposed in a second one of the columns different than the first one of the columns.

13. A memory device, comprising: a semiconductor substrate;
a plurality of memory cells formed on the semiconductor substrate; and
circuitry formed on the semiconductor substrate and configured to:
read a first memory cell of the plurality of memory cells to generate a first read current;
read a second memory cell of the plurality of memory cells to generate a second read current;
apply a first offset value to the second read current; then
combine the first read current and the second read current having the first offset value to form a third read current; then
determine a program state using the third read current.

14. The device of claim 13, wherein the combining comprises adding the first read current and the second read current having the first offset value together.

15. The device of claim 13, wherein the circuitry is further configured to:
read a third memory cell of the plurality of memory cells to generate a fourth read current;
applying a second offset value to the fourth read current;
wherein the combining including combining the first read current, the second read current having the first offset value and the fourth read current having the second offset value to form the third read current.

16. The device of claim 15, wherein the second offset value is different from the first offset value.

17. The device of claim 15, wherein the combining comprises adding the first read current, the second read current having the first offset value and the fourth read current having the second offset value together.

18. The device of claim 13, wherein:
the plurality of memory cells are arranged in an array of rows and columns of the memory cells;
each of the columns includes a bit line connected to the memory cells therein;
the first memory cell is disposed in a first one of the columns; and
the second memory cell is disposed in a second one of the columns different than the first one of the columns.

19. A memory device, comprising: a semiconductor substrate;
a plurality of memory cells formed on the semiconductor substrate; and
circuitry formed on the semiconductor substrate and configured to:
read a first memory cell of the plurality of memory cells to generate a first read current;
read a second memory cell of the plurality of memory cells to generate a second read current;
generate a first voltage from the first read current;
generate a second voltage from the second read current;
apply a first offset value to the second voltage; then
combine the first voltage and the second voltage having the first offset value to form a third voltage; then
determine a program state using the third voltage.

20. The device of claim 19, wherein the combining comprises adding the first voltage and the second voltage having the first offset value together.

21. The device of claim 19, wherein the circuitry is further configured to: read a third memory cell of the plurality of memory cells to generate a third read current;
generate a fourth voltage from the third read current;
apply a second offset value to the fourth voltage;
wherein the combining including combining the first voltage, the second voltage having the first offset value and the fourth voltage having the second offset value to form the third voltage.

22. The device of claim 21, wherein the second offset value is different from the first offset value.

23. The device of claim 21, wherein the combining comprises adding the first voltage, the second voltage having the first offset value and the fourth voltage having the second offset value together.

24. The device of claim 19, wherein:
the plurality of memory cells are arranged in an array of rows and columns of the memory cells;
each of the columns includes a bit line connected to the memory cells therein;
the first memory cell is disposed in a first one of the columns; and
the second memory cell is disposed in a second one of the columns different than the first one of the columns.

* * * * *